(12) United States Patent
Kline

(10) Patent No.: US 8,624,294 B2
(45) Date of Patent: Jan. 7, 2014

(54) SEMICONDUCTOR WITH POWER GENERATING PHOTOVOLTAIC LAYER

(75) Inventor: Eric V. Kline, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 557 days.

(21) Appl. No.: 12/938,173

(22) Filed: Nov. 2, 2010

(65) Prior Publication Data
US 2012/0103402 A1    May 3, 2012

(51) Int. Cl.
*H01L 31/00* (2006.01)

(52) U.S. Cl.
USPC .... 257/184; 257/431; 257/444; 257/E25.009; 438/19; 438/48; 438/66; 438/88; 438/98

(58) Field of Classification Search
USPC ............ 438/19, 48, 66, 88, 98; 257/184, 431, 257/444, E25.009
See application file for complete search history.

(56) References Cited

U.S. PATENT DOCUMENTS

| | | | |
|---|---|---|---|
| 3,899,696 A | | 8/1975 | Fletcher et al. |
| 4,710,977 A | | 12/1987 | Lemelson |
| 5,796,481 A | * | 8/1998 | Downing, Jr. ................. 356/343 |
| 7,098,394 B2 | * | 8/2006 | Armer et al. ................... 136/244 |
| 7,351,907 B2 | | 4/2008 | Gaudiana et al. |
| 7,479,401 B2 | | 1/2009 | Lai et al. |
| 7,791,481 B2 | | 9/2010 | Landt et al. |
| 2004/0255096 A1 | * | 12/2004 | Norman ........................... 712/11 |
| 2008/0230112 A1 | * | 9/2008 | Barnham et al. .............. 136/249 |
| 2009/0032085 A1 | | 2/2009 | Grumazescu |
| 2010/0213607 A1 | * | 8/2010 | Smeys et al. ................... 257/723 |
| 2010/0225178 A1 | | 9/2010 | Shon |
| 2011/0315992 A1 | * | 12/2011 | Nguyen et al. .................. 257/66 |

OTHER PUBLICATIONS

Wells, The Chips Are Coming, Access Excellence Resource Center, The National Health Museum, downloaded on Sep. 22, 2010, http://www.accessexcellence.org/RC/AB/BA/biochip.php.
Mini helicopter flies using laser power, Brahmand.com Defence & Acrospace News, Posted Sep. 3, 2010, http://www.brahmand.com/news/Mini-helicopter-flies-using-laser-power/4824/1/14.html.

* cited by examiner

*Primary Examiner* — Thanh V Pham
(74) *Attorney, Agent, or Firm* — Kunzler Law Group

(57) ABSTRACT

An apparatus, system, and method are disclosed for providing optical power to a semiconductor chip. An active semiconductor layer of the semiconductor chip is disposed toward a front side of the semiconductor chip. The active semiconductor layer comprises one or more integrated circuit devices. A photovoltaic semiconductor layer of the semiconductor chip is disposed between the active semiconductor layer and a back side of the semiconductor chip. The back side of the semiconductor chip is opposite the front side of the semiconductor chip. The photovoltaic semiconductor layer converts electromagnetic radiation to electric power. One or more conductive pathways between the photovoltaic semiconductor layer and the active semiconductor layer provide the electric power from the photovoltaic semiconductor layer to the one or more integrated circuit devices of the active semiconductor layer.

23 Claims, 7 Drawing Sheets

SEMICONDUCTOR WITH POWER GENERATING PHOTOVOLTAIC LAYER

FIELD

The subject matter disclosed herein relates to semiconductor chips and more particularly relates to providing power to semiconductor chips.

BACKGROUND

Description of the Related Art

Semiconductor chips with integrated circuits are a part of most modern electronic devices. The distribution of electric power is central to the operation of these semiconductor chips. In some semiconductor chips, fifty percent or more of inputs and outputs are dedicated to power distribution. Similarly, a quarter to a third of the layers of a circuit board upon which a semiconductor chip is mounted are often dedicated to power, ground, and other power distribution functions.

Traditional electrical power connections can also be affected by electromigration, parasitic capacitances, voltage drops, and the like. These effects can complicate the design of traditional power distribution circuits for semiconductor chips and can reduce the efficiency of traditional power distribution.

BRIEF SUMMARY

From the foregoing discussion, it should be apparent that a need exists for an apparatus, system, and method that provide power to a semiconductor chip. Beneficially, such an apparatus, system, and method would provide power to a semiconductor chip optically.

The present invention has been developed in response to the present state of the art, and in particular, in response to the problems and needs in the art that have not yet been fully solved by currently available power distribution systems. Accordingly, the present invention has been developed to provide an apparatus, system, and method for optical power distribution that overcome many or all of the above-discussed shortcomings in the art.

The apparatus to provide optical power to a semiconductor chip is provided with a plurality of elements configured to functionally execute the necessary steps of providing power to a semiconductor chip optically. These elements in the described embodiments include an active semiconductor layer, a photovoltaic semiconductor layer, and one or more conductive pathways.

The active semiconductor layer, in one embodiment, is disposed toward a front side of the semiconductor chip. In a further embodiment, the active semiconductor layer includes one or more integrated circuit devices. The photovoltaic semiconductor layer, in one embodiment, is disposed between the active semiconductor layer and a back side of a semiconductor chip. The back side of the semiconductor chip, in another embodiment, is opposite the front side of the semiconductor chip. In a further embodiment, the photovoltaic semiconductor layer converts electromagnetic radiation to electric power. In one embodiment, the one or more conductive pathways are between the photovoltaic semiconductor layer and the active semiconductor layer. The one or more conductive pathways, in another embodiment, provide the electric power from the photovoltaic semiconductor layer to the one or more integrated circuit devices of the active semiconductor layer.

A system of the present invention is also presented to provide optical power to a semiconductor. In the described embodiments, the system includes a semiconductor chip, an electromagnetic radiation source, a photovoltaic semiconductor layer, an active semiconductor layer, and one or more conductive pathways.

In one embodiment, the semiconductor chip includes a front side and a back side. The front side of the semiconductor chip, in another embodiment, is opposite the back side of the semiconductor chip. The electromagnetic radiation source, in one embodiment, impinges electromagnetic radiation onto the back side of the semiconductor chip.

The active semiconductor layer of the semiconductor chip, in one embodiment, is disposed toward the front side of the semiconductor chip. In another embodiment, the active semiconductor layer includes one or more integrated circuit devices. The photovoltaic semiconductor layer of the semiconductor chip, in one embodiment, is disposed between the active semiconductor layer and the back side of the semiconductor chip. In a further embodiment, the photovoltaic semiconductor layer converts electromagnetic radiation to electric power. The one or more conductive pathways of the semiconductor chip, in certain embodiments, are between the photovoltaic semiconductor layer and the active semiconductor layer. In a further embodiment, the one or more conductive pathways provide the electric power from the photovoltaic semiconductor layer to the one or more integrated circuit devices of the active semiconductor layer.

A method of the present invention is also presented for providing optical power to a semiconductor. The method in the disclosed embodiments substantially includes the steps necessary to carry out the functions presented above with respect to the operation of the described apparatus and system. In one embodiment, the method includes impinging electromagnetic radiation onto a back side of a semiconductor chip. In a further embodiment, the method includes converting the electromagnetic radiation to electric power using a photovoltaic semiconductor layer of the semiconductor chip.

The photovoltaic semiconductor layer, in one embodiment, is disposed between an active semiconductor layer of the semiconductor chip and the back side of the semiconductor chip. In another embodiment, the method includes providing the electric power from the photovoltaic semiconductor layer to one or more integrated circuit devices of the active semiconductor layer of the semiconductor chip. The method, in one embodiment, provides the electric power using one or more conductive pathways between the photovoltaic semiconductor layer and the active semiconductor layer. The active semiconductor layer, in a further embodiment, is disposed toward a front side of the semiconductor chip opposite the back side of the semiconductor chip.

Another apparatus to provide optical power to a semiconductor chip is provided with a plurality of elements configured to functionally execute the necessary steps of providing power to a semiconductor chip optically. These elements in the described embodiments include an active semiconductor layer, a photovoltaic semiconductor layer, a bulk semiconductor layer, and one or more conductive pathways.

The active semiconductor layer, in one embodiment, is disposed toward a front side of a silicon-based semiconductor chip. The active semiconductor layer, in a further embodiment, includes one or more complementary metal-oxide-semiconductor ("CMOS") logic integrated circuit devices. The photovoltaic semiconductor layer, in one embodiment, is disposed between the active semiconductor layer and a back side of the silicon-based semiconductor chip. The back side of the silicon-based semiconductor chip, in another embodiment, is opposite the front side of the silicon-based semiconductor chip. The photovoltaic semiconductor layer, in another embodiment, converts the electromagnetic radiation to electric power.

The bulk semiconductor layer, in one embodiment, is disposed between the photovoltaic semiconductor layer and the back side of the semiconductor chip. The photovoltaic semiconductor layer, in another embodiment, receives electromagnetic radiation from an electromagnetic radiation source at one or more wavelengths to which the bulk semiconductor layer is substantially transparent. At least a portion of the electromagnetic radiation, in certain embodiments, passes through the bulk semiconductor layer to the photovoltaic semiconductor layer.

The one or more conductive pathways, in one embodiment, are between the photovoltaic semiconductor layer and the active semiconductor layer. In another embodiment, the one or more conductive pathways provide the electric power from the photovoltaic semiconductor layer to the one or more CMOS logic integrated circuit devices of the active semiconductor layer.

References throughout this specification to features, advantages, or similar language do not imply that all of the features and advantages may be realized in any single embodiment. Rather, language referring to the features and advantages is understood to mean that a specific feature, advantage, or characteristic is included in at least one embodiment. Thus, discussion of the features and advantages, and similar language, throughout this specification may, but do not necessarily, refer to the same embodiment.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of embodiments as set forth hereinafter.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1A:
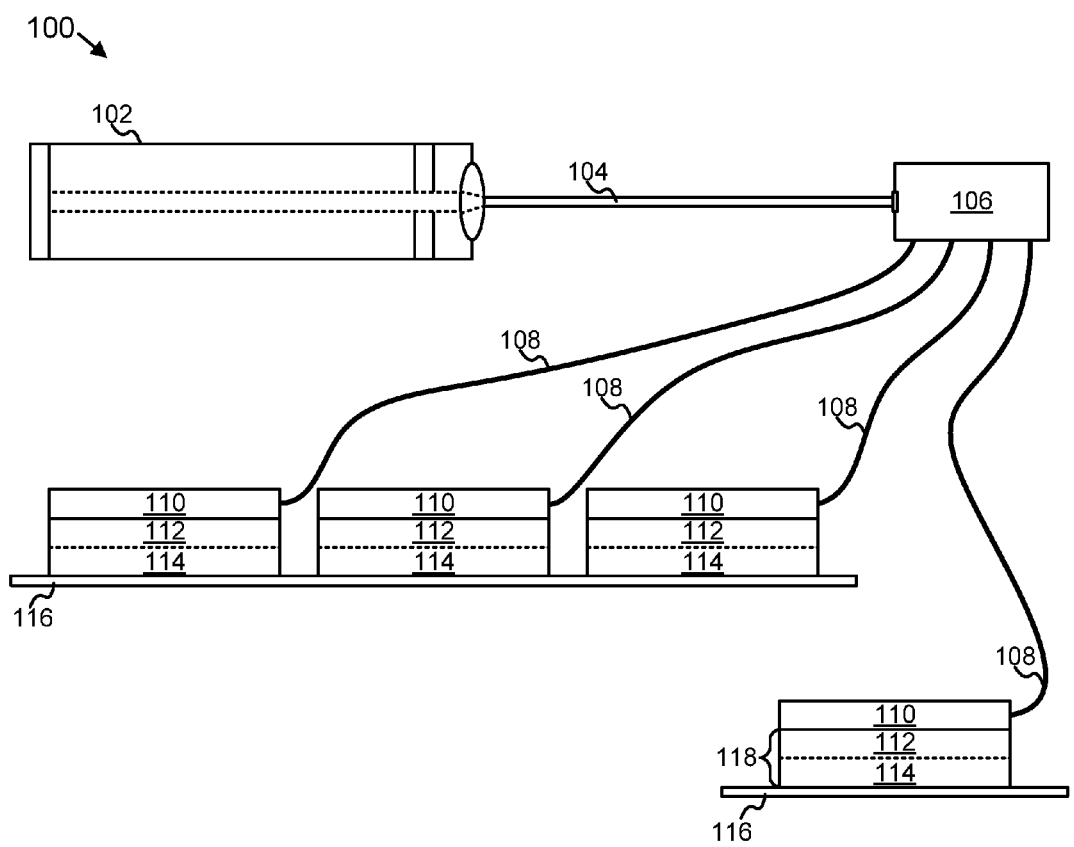
FIG. 1A is a schematic block diagram illustrating one embodiment of a system to provide optical power to a semiconductor in accordance with the present invention.

As will be appreciated by one skilled in the art, aspects of the present invention may be embodied as an apparatus, system, or method. Accordingly, aspects of the present invention may take the form of an entirely hardware embodiment or an embodiment combining software and hardware aspects that may all generally be referred to herein as a "circuit," "module," or "system."

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and the like according to embodiments of the invention. It will be understood that each block of the schematic flowchart diagrams and/or schematic block diagrams, and combinations of blocks in the schematic flowchart diagrams and/or schematic block diagrams, can be implemented by semiconductor devices, electrical circuits, logic circuits, hardware, or the like.

The schematic flowchart diagrams and/or schematic block diagrams in the Figures illustrate the architecture, functionality, and operation of possible implementations of apparatuses, systems, and methods according to various embodiments of the present invention. In this regard, each block in the schematic flowchart diagrams and/or schematic block diagrams may represent a module, segment, material, layer, or portion of hardware, which implements the specified function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures. Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment.

FIG. 1A depicts one embodiment of a system 100 to provide optical power to one or more semiconductor chips 118. In the depicted embodiment, the system 100 includes an electromagnetic radiation source 102, electromagnetic radiation 104, a beam splitter 106, one or more fiber optic channels 108, one or more radiation diffusers 110, one or more circuit boards 116, and one or more semiconductor chips 118. Each semiconductor chip 118, in the depicted embodiment, includes a photovoltaic semiconductor layer 112 and an active semiconductor layer 114. The system 100, in one embodiment, distributes electromagnetic radiation 104 along engineered propagation pathways to the one or more semiconductor chips 118 and the photovoltaic semiconductor layers 112 of the semiconductor chips 118 convert the electromagnetic radiation 104 to electric power to power the active semiconductor layers 114 of the semiconductor chips 118.

Electromagnetic radiation 104 includes radio waves, microwaves, infrared radiation, visible light, ultraviolet radiation, X-rays, gamma rays, and the like. Distributing energy as electromagnetic radiation 104 instead of using traditional electrical distribution, in certain embodiments, may reduce the number of inputs and outputs of the system 100 that are dedicated to power distribution. In semiconductor chips that receive power using traditional electrical distribution, up to fifty percent or more of inputs and outputs of a semiconductor chip may be dedicated to power distribution. Similarly, a quarter to a third of the layers of a circuit board are typically dedicated to power, ground, and other power distribution functions.

In certain embodiments, the semiconductor chips 118 of the system 100 may have few if any inputs or outputs for power distribution, receiving their power from the electromagnetic radiation 104 instead. The one or more circuit boards 116 of the system 100, in another embodiment, may have few if any power distribution layers. Further, in various embodiments, using electromagnetic waves to distribute power to the semiconductor chips 118 may reduce or eliminate the negative effects of electromigration, parasitic capacitances, voltage drops, and the like associated with traditional electrical power distribution.

In one embodiment, the electromagnetic radiation source 102 is an optical power source for the system 100, generating, collecting, directing, and/or otherwise providing the electromagnetic radiation 104 to the system 100. The electromagnetic radiation source 102, in one embodiment, provides incoherent electromagnetic radiation 104, such as sunlight, fluorescent radiation, incandescent radiation, or the like. In a further embodiment, the electromagnetic radiation source 102 provides the electromagnetic radiation 104 as a coherent beam, such as a laser beam, or the like, that has a substantially uniform relative phase (or set of several substantially uniform relative phases). For example, in various embodiments, the electromagnetic radiation source 102 may include gas lasers, such as carbon dioxide ("$CO_2$") lasers, helium-neon ("HeNe") lasers, and the like, solid-state lasers such as yttrium aluminum garnet ("Nd:YAG") lasers, ruby lasers, and the like, and/or other types of lasers.

In one embodiment, the electromagnetic radiation source 102 provides the electromagnetic radiation 104 as a coherent beam that is substantially constant over time during operation of the electromagnetic radiation source 102, i.e. in a continuous wave mode with substantially constant-amplitude output. In other embodiments, the electromagnetic radiation source 102 may provide the electromagnetic radiation 104 in various pulse operation modes, with an output amplitude that is not constant over time, such as a Q-switched operation mode, a modelocking operation mode, a pulsed pumping operation mode, or the like.

In another embodiment, the electromagnetic radiation source 102 provides the electromagnetic radiation 104 at one or more optimal wavelengths for the photovoltaic semiconductor layers 112 of the one or more semiconductor chips 118. In one embodiment, the electromagnetic radiation source 102 provides the electromagnetic radiation 104 at one or more wavelengths to which a bulk semiconductor layer (not shown) is substantially transparent, but which semiconductors (including associated dopants) of the photovoltaic semiconductor layer 112 readily absorb. One example embodiment of a bulk semiconductor layer is described below with regard to FIG. 2B.

For example, in certain embodiments, a bulk semiconductor layer of silicon, such as monocrystalline silicon or the like, may be transparent to wavelengths between about 0.8 microns and about 2 microns and p-type and n-type doped silicon of a photovoltaic semiconductor layer 112 may absorb wavelengths between about 0.8 microns and about 2 microns. In certain embodiments, where a bulk semiconductor layer is disposed between a photovoltaic semiconductor layer 112 and the back side of a semiconductor chip 118, providing the electromagnetic radiation 104 at wavelengths to which the bulk semiconductor layer is substantially transparent allows at least a portion of the electromagnetic radiation 104 to travel through the bulk semiconductor layer into the photovoltaic semiconductor layer 112 where photons of the electromagnetic radiation 104 may be absorbed, freeing electrons to create an electric current and generate electric power. In a further embodiment, substantially all of the electromagnetic radiation 104 passes through a bulk semiconductor layer to the photovoltaic semiconductor layer 112.

In another embodiment, the electromagnetic radiation source 102 may provide the electromagnetic radiation 104 at one or more wavelengths selected based on a band gap of photovoltaic elements (such as p-n junctions, or the like) of the photovoltaic semiconductor layers 112. For example, the electromagnetic radiation source 102, in certain embodiments, may provide the electromagnetic radiation 104 at one or more wavelengths with energy levels at or above a band gap associated with the photovoltaic elements of the photovoltaic semiconductor layers 112 to optimize the thermodynamic efficiency of the photovoltaic semiconductor layers 112, or the like.

The electromagnetic radiation source 102, in one embodiment, impinges the electromagnetic radiation 104 onto the back sides of the one or more semiconductor chips 118. In the depicted embodiment, the electromagnetic radiation source 102 directs the electromagnetic radiation 104 to the one or more semiconductor chips 118 using one or more fiber optic channels 108 to guide the electromagnetic radiation 104. In the embodiment described below with regard to FIG. 1B, the electromagnetic radiation source 102 directs the electromagnetic radiation 104 to the one or more semiconductor chips 118 using one or more mirrors 152. In another embodiment, the electromagnetic radiation source 102 may direct the electromagnetic radiation 104 directly to the back sides of the one or more semiconductor chips 118, or the like. For example, in various embodiments, the electromagnetic radiation source 102 may include one or more fluorescent and/or incandescent lamps shining directly on the one or more semiconductor chips 118, a laser or other coherent beam aimed directly at the one or more semiconductor chips 118, or the like.

In the depicted embodiment, the electromagnetic radiation source 102 directs the electromagnetic radiation 104 to the beam splitter 106, which divides the electromagnetic radiation 104 between the depicted semiconductor chips 118. In one embodiment, the beam splitter 106 divides the electromagnetic radiation 104 substantially equally. In a further embodiment, the beam splitter 106 divides the electromagnetic radiation 104 based on electric power needs of the different semiconductor chips 118, or the like, providing a greater proportion of the electromagnetic radiation 104 to certain semiconductor chips 118 than to other semiconductor chips 118. The beam splitter 106, in various embodiments, may include one or more prisms, minors, lenses, fiber optics, or the like to divide the input electromagnetic radiation 104 from a single input bean into multiple output beams.

In the depicted embodiment, each output of the beam splitter 106 corresponds to a fiber optic channel 108. Each fiber optic channel 108, in the depicted embodiment, directs the split electromagnetic radiation 104 to the photovoltaic semiconductor layer 112 of a semiconductor chip 118 such that the electromagnetic radiation 104 impinges onto the back side of the semiconductor chip 118. In one embodiment (as depicted), the semiconductor chip 118 includes a radiation diffuser 110 which spreads or diffuses the electromagnetic radiation 104 over the back side of the semiconductor chip 118.

A radiation diffuser 110, in various embodiments, may include one or more lenses, minors, diffusion surfaces such as diffusion glass or plastic, or the like that diffuse or spread electromagnetic radiation 104. For example, in one embodiment where the electromagnetic radiation 104 includes a coherent laser beam, or the like, instead of aiming the beam at a single spot on the back side of a semiconductor chip 118, the radiation diffuser 110 spreads or diffuses the beam over a greater area of the back side of the semiconductor chip 118, exposing a greater portion of the photovoltaic semiconductor layer 112 of the semiconductor chip 118 to the electromagnetic radiation 104. In one embodiment, a radiation diffuser 110 is integrated with a chip package, chip container, or other chip carrier of a semiconductor chip 118.

In one embodiment, photovoltaic elements of the photovoltaic semiconductor layer 112 are disposed in a subset of the area of the back side of a semiconductor chip 118, and the radiation diffuser 110 directs the electromagnetic radiation 104 at the subset of the back side of the semiconductor chip 118. In a further embodiment, the radiation diffuser 110 spreads the electromagnetic radiation 104 over the subset of the back side of the semiconductor chip 118 with little or no electromagnetic radiation 104 impinging on the back side of the semiconductor chip 118 outside of the subset with photovoltaic elements. In one embodiment, areas of photovoltaic elements in the photovoltaic semiconductor layer 112 of a semiconductor chip 118 may be arranged in a predefined pattern. In another embodiment, active integrated circuit devices may be disposed in the photovoltaic semiconductor layer 112 between and/or at the perimeter of photovoltaic element areas.

In one embodiment, the one or more semiconductor chips 118 are disposed on one or more circuit boards 116. The circuit boards 116, in various embodiments, may be referred to as printed circuit boards, printed wiring boards, etched wiring boards, printed circuit assemblies, printed circuit board assemblies, or the like. The one or more circuit boards 116, in one embodiment, provide electrical signal input and output connections for the one or more semiconductor chips 118. In a further embodiment, the one or more circuit boards 116 provide mechanical support for the one or more semiconductor chips 118. A circuit board 116, in various embodiments, may include several conductive and non-conductive layers to provide electrical connections, mechanical support, and the like.

In one embodiment, the one or more circuit boards 116 do not include traditional power distribution layers, because power is distributed to the one or more semiconductor chips 118 optically as electromagnetic radiation 104. In a further embodiment, a circuit board 116 includes one or more power distribution layers that distribute electric power from a semiconductor chip 118 with a photovoltaic semiconductor layer 112 to another semiconductor chip 118 without a photovoltaic semiconductor layer 112, to power the other semiconductor chip 118 that lacks a photovoltaic semiconductor layer 112.

In one embodiment, one of the circuit boards 116 comprises a motherboard and one or more other circuit boards 116 comprise daughter cards of the motherboard. For example, in one embodiment, the system 100 may be embodied by a computing system, such as a desktop computer, a server computer, a laptop computer, or the like, and the electromagnetic radiation source 102 may provide optical power to one or more semiconductor chips 118 on the motherboard and one or more semiconductor chips 118 on daughter cards, such as peripheral component interconnect ("PCI") cards, PCI express ("PCIe") cards, dual in-line memory modules ("DIMMs"), or the like. In one embodiment, the fiber optic channels 108 include one or more pluggable connectors, allowing semiconductor chips 118 and/or circuit boards 116 to be added and removed from the system 100.

In one embodiment, a semiconductor chip 118 may be silicon-based (i.e. including silicon, silicon alloys, or the like), with a silicon-based photovoltaic semiconductor layer 112 and a silicon-based active semiconductor layer 114. Silicon-based photovoltaic semiconductor layers 112 and/or silicon-based active semiconductor layers 114, in various embodiments, may include monocrystalline silicon, polycrystalline silicon, amorphous silicon, silicon alloys, silicon dioxide ("$SiO_2$"), epitaxial silicon ("epi-Si"), and/or combinations of different types of silicon.

In another embodiment, a semiconductor chip 118 may include another semiconductor material, such as a III-V semiconductor or the like. Examples of III-V semiconductors include gallium arsenide ("GaAs"), indium phosphide ("InP"), and/or other III-V semiconductors. In a further embodiment, the photovoltaic semiconductor layer 112 of a semiconductor chip 118 may include one type of semiconductor material and the active semiconductor layer 114 may include a different type of semiconductor material. For example, in one embodiment, the photovoltaic semiconductor layer 112 of a semiconductor chip 118 may be III-V semiconductor-based and the active semiconductor layer 114 of the semiconductor chip 118 may be silicon-based, or the like.

In one embodiment, at least a portion of one of a photovoltaic semiconductor layer 112 and an active semiconductor layer 114 is epitaxially grown on the other layer. For example, in one embodiment, a photovoltaic semiconductor layer 112 may be used as a substrate or seed layer and an active semiconductor layer 114 may be epitaxially grown on the photovoltaic semiconductor layer 112 using a pyrolysis process or other epitaxial chemical vapor deposition process. The photovoltaic semiconductor layer 112 and/or the active semiconductor layer 114 of a semiconductor chip 118, in various embodiments, may undergo one or more photolithographic imaging, deposition, etching, doping, and/or cleaning processes during fabrication to form photovoltaic elements of the photovoltaic semiconductor layer 112 and/or integrated circuit devices of the active semiconductor layer 114, or the like. In certain embodiments, a photovoltaic semiconductor layer 112 and/or an active semiconductor layer 114 may include one or more metallization layers, with copper, aluminum, tungsten, gold, and/or other conductors.

The system 100, in the depicted embodiment, includes several semiconductor chips 118 that each include a photovoltaic semiconductor layer 112 and an active semiconductor layer 114. In other embodiments, the system 100 may include a single semiconductor chip 118 with a photovoltaic semiconductor layer 112 and an active semiconductor layer 114, one or more semiconductor chips 118 without photovoltaic semiconductor layers 112, or the like.

A semiconductor chip 118, in one embodiment, has a front side and a back side, opposite each other. The front side of a semiconductor chip 118, in certain embodiments, is the side on which active integrated circuit devices are built up or deposited. The front side, in certain embodiments, includes one or more electric contacts, such as solder bumps, contact pads, or the like for the active integrated circuit devices. The back side of a semiconductor chip 118 is opposite the front side of the semiconductor chip 118. In certain embodiments, the back side of a semiconductor chip 118 is the bulk semiconductor substrate side of the semiconductor chip 118, opposite the active integrated circuit devices.

In one embodiment, a photovoltaic semiconductor layer 112 is disposed between the active semiconductor layer 114 and the back side of a semiconductor chip 118. The photovoltaic semiconductor layer 112, in various embodiments, may be disposed on and/or toward the back side of a semiconductor chip 118 or a bulk semiconductor layer may be disposed between the photovoltaic semiconductor layer 112 and the back side of the semiconductor chip 118. In other embodiments, the photovoltaic semiconductor layer 112 may be disposed on a side of a semiconductor chip 118 perpendicular to the front and back sides (i.e. an edge side of the semiconductor chip 118), and the electromagnetic radiation source 102 may impinge the electromagnetic radiation 104 onto the perpendicular side.

The photovoltaic semiconductor layer 112 converts the electromagnetic radiation 104 to electric power for the semiconductor chip 118. In one embodiment, a photovoltaic semiconductor layer 112 includes an n-type semiconductor layer disposed adjacent to a p-type semiconductor layer forming a p-n junction that converts the electromagnetic radiation 104 to electric power using the photovoltaic effect. In further embodiments, the photovoltaic semiconductor layer 112 may include other layers, such as an anti-reflective layer, an oxide layer of silicon dioxide or another oxide, or the like.

In one embodiment, the active semiconductor layer 114 is disposed toward the front side of a semiconductor chip 118. The active semiconductor layer 114 includes one or more active integrated circuit devices, such as transistors, diodes, capacitors, inductors, resistors, and/or other semiconductor devices, passive components, or the like. The integrated circuit devices, in certain embodiments, may form one or more logic gates, memory cells, and/or other types of integrated circuits. The one or more integrated circuit devices of an active semiconductor layer 114, in a further embodiment, include complementary metal-oxide-semiconductor ("CMOS") logic integrated circuit devices, that use a combination of p-type and n-type metal-oxide-semiconductor field-effect transistors ("MOSFETs') to implement logic gates or other circuits. In other embodiments, the one or more integrated circuit devices of an active semiconductor layer 114 may include n-type metal-oxide-semiconductor ("NMOS") logic, p-type metal-oxide-semiconductor ("PMOS") logic, transistor-transistor logic ("TTL"), diode-transistor logic ("DTL"), emitter-coupled logic ("ECL"), bipolar CMOS ("BiCMOS"), integrated injection logic ("IIL"), and/or other types of logic circuits.

The system 100, in a further embodiment, includes one or more conductive pathways between a photovoltaic semiconductor layer 112 and a corresponding active semiconductor layer 114 to provide electric power to the integrated circuit devices of the active semiconductor layer 114. In one embodiment, the conductive pathways are in electrical communication with electrical conductors on each side of a photovoltaic semiconductor layer 112 to transport carriers out of the photovoltaic semiconductor layer 112 and provide the generated electric power to the integrated circuit devices of the active semiconductor layer 114.

The one or more conductive pathways, in one embodiment, provide the electric power to one or more power conditioning circuits that convert the electric power to a form usable by the integrated circuit devices and deliver the converted electric power to the integrated circuit devices. In a further embodiment, the one or more conductive pathways may provide the electric power to the integrated circuit devices over an integrated circuit power net of a semiconductor chip 118. The one or more conductive pathways may be deposited as one or more metallization layers during a fabrication process, may be wired or metalized along an edge of a semiconductor chip 118, and/or otherwise disposed in electrical communication with a photovoltaic semiconductor layer 112 and an active semiconductor layer 114. The one or more conductive pathways, the electrical conductors on each side of a photovoltaic semiconductor layer 112, the one or more power conditioning circuits, and the integrated circuit power net are described in greater detail below with regard to FIGS. 2A, 2B, and 3.

Figure 1B:
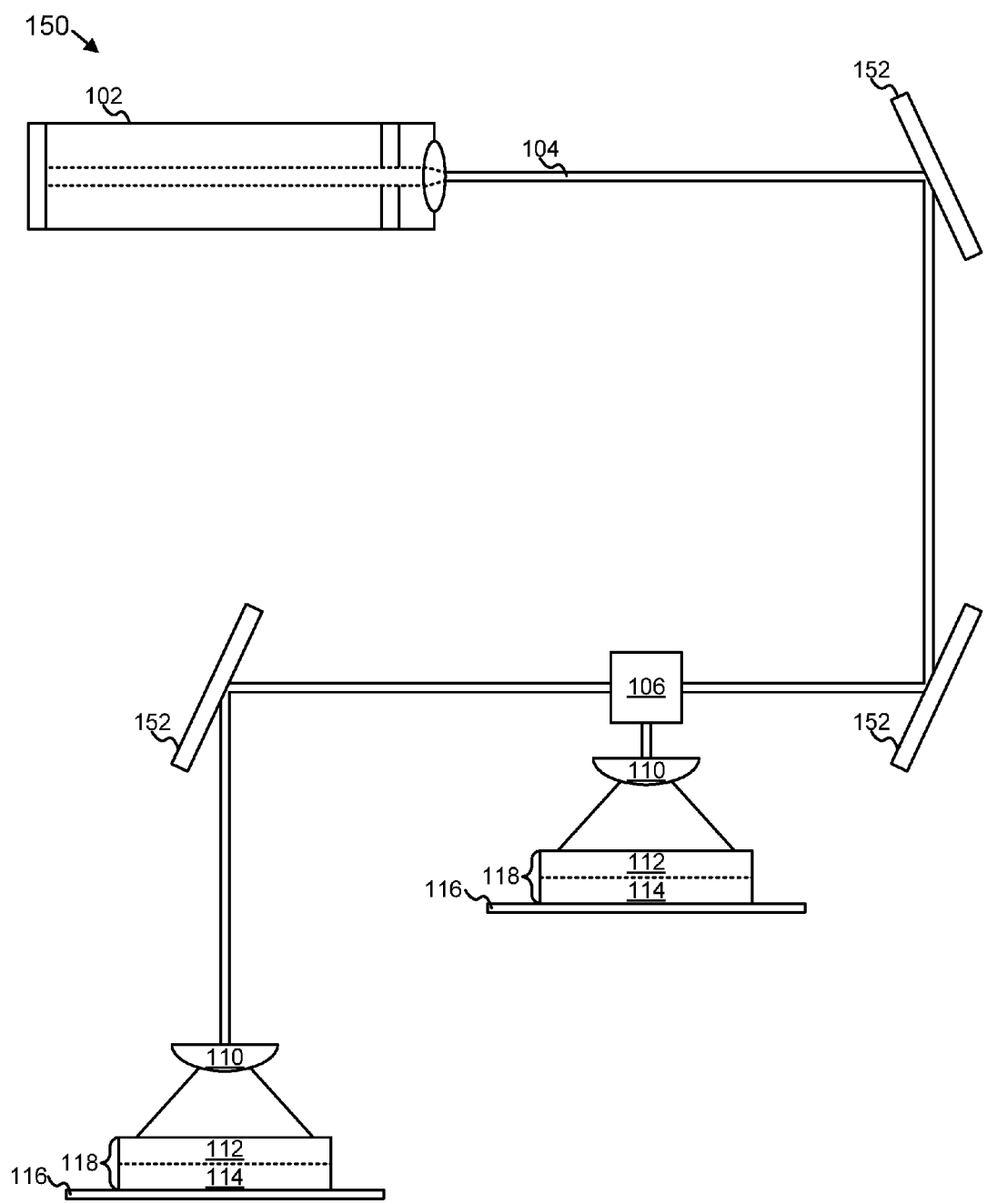
FIG. 1B is a schematic block diagram illustrating another embodiment of a system to provide optical power to a semiconductor in accordance with the present invention.

FIG. 1B depicts an embodiment of a system 150 to provide optical power to one or more semiconductor chips 118. The system 150 of FIG. 1B is substantially similar to the system 100 of FIG. 1A, but distributes the electromagnetic radiation 104 using one or more minors 152 instead of the one or more fiber optic channels 108. In the depicted embodiment, the one or more mirrors 152 are positioned to reflect the electromagnetic radiation 104 from the electromagnetic radiation source 102 to the photovoltaic semiconductor layers 112 of the semiconductor chips 118 so that the electromagnetic radiation 104 impinges onto the back side of the semiconductor chip 118. In one embodiment, the one or more mirrors 152 direct the electromagnetic radiation 104 around obstructions in the system 150, such as other components, circuit boards 116, enclosure walls, or the like so that the electromagnetic radiation 104 reaches the semiconductor chips 118 substantially unobstructed.

In one embodiment (as depicted), the one or more minors 152 direct the electromagnetic radiation 104 to a beam splitter 106 that splits the electromagnetic radiation 104 between the depicted semiconductor chips 118. The beam splitter 106 and the one or more mirrors 152, in the depicted embodiment, direct the electromagnetic radiation 104 through a radiation diffuser 110 for each semiconductor chip 118. As described above with regard to FIG. 1A, a radiation diffuser 110, in various embodiments, may include one or more lenses, minors, diffusion surfaces such as diffusion glass or plastic, or the like that diffuse or spread electromagnetic radiation 104. In the depicted embodiment, the radiation diffusers 110 spread or diffuse the electromagnetic radiation 104 over at least a portion of the backsides of the semiconductor chips 118, defocusing the beam of electromagnetic radiation 104 from the electromagnetic radiation source 102.

Figure 2A:
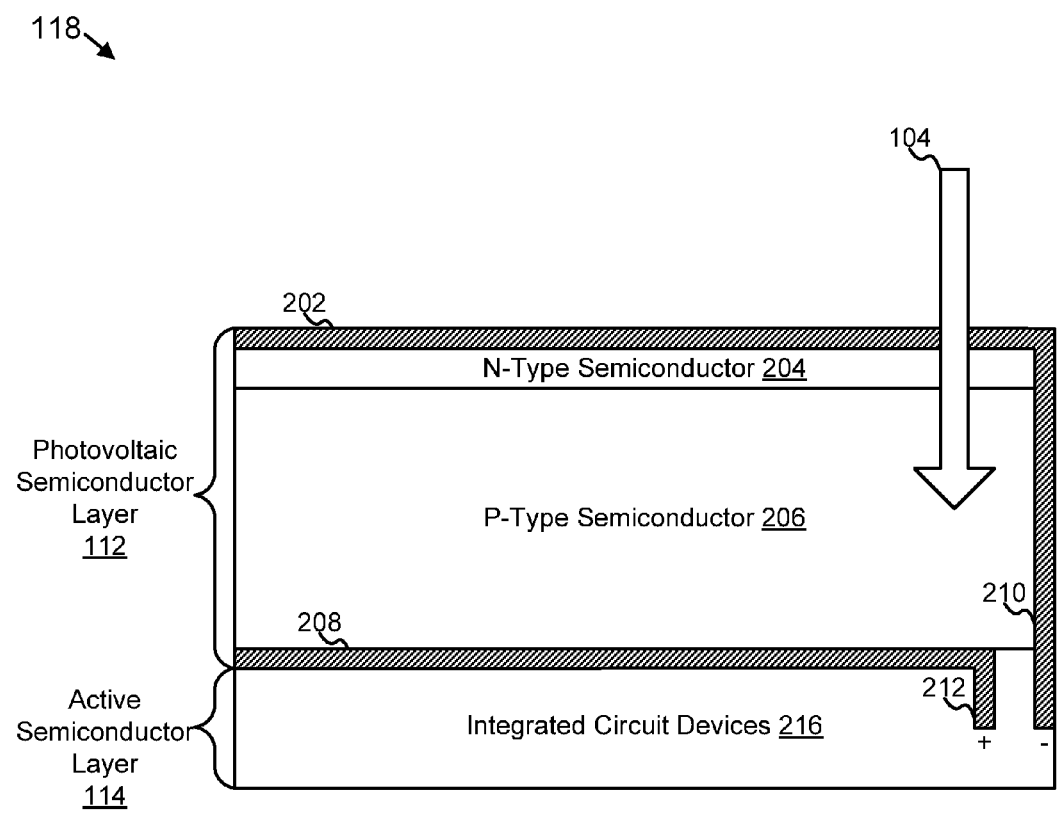
FIG. 2A is a cross-sectional schematic block diagram illustrating one embodiment of a semiconductor chip in accordance with the present invention.

FIG. 2A depicts one embodiment of a semiconductor chip 118. In the depicted embodiment, the semiconductor chip 118 includes the photovoltaic semiconductor layer 112 and the active semiconductor layer 114. The photovoltaic semiconductor layer 112, in the depicted embodiment, includes one or more negative polarity electrical conductors 202, an n-type semiconductor layer 204, a p-type semiconductor layer 206, and one or more positive polarity electrical conductors 208. The active semiconductor layer 114, in the depicted embodiment, includes one or more integrated circuit devices 216. The depicted embodiment further includes one or more conductive pathways 210, 212 between the photovoltaic semiconductor layer 112 and the active semiconductor layer 114.

Figure 3:
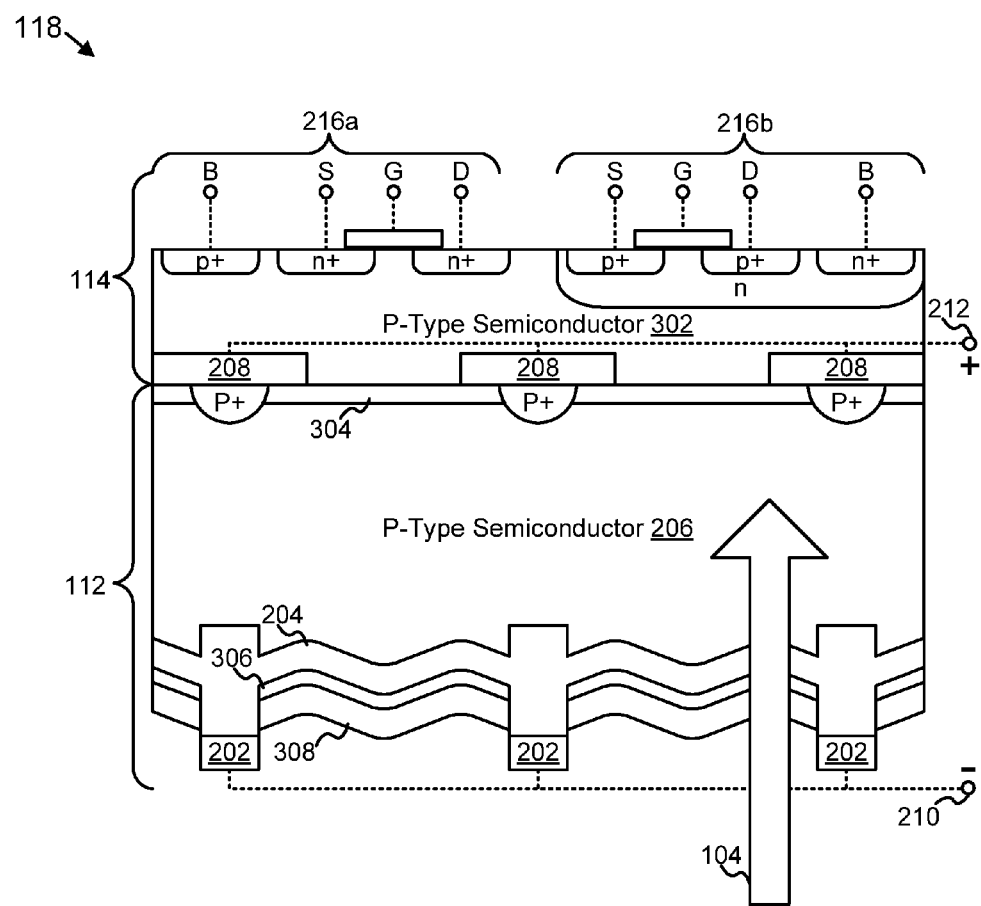
FIG. 3 is a cross-sectional schematic block diagram illustrating a further embodiment of a semiconductor chip in accordance with the present invention.

The semiconductor chip 118, as depicted, is oriented with the integrated circuit devices 216 and the front side of the semiconductor chip 118 facing downward, in an orientation in which the semiconductor chip 118, in certain embodiments, may be mounted in on a circuit board 116, or the like. A view of a semiconductor chip 118 in a traditional integrated circuit orientation, with the integrated circuit devices 216 and the front side of the semiconductor chip 118 facing upward, as they may face during fabrication or the like, is depicted in FIG. 3. One of skill in the art, in light of this disclosure, will recognize various possible orientations for the semiconductor chip 118, which are anticipated herein.

In one embodiment, the n-type semiconductor layer 204 of the photovoltaic semiconductor layer 112 has electrons as the majority charge carrier. The n-type semiconductor layer 204, in one embodiment, includes a semiconductor with dopant atoms that provide extra electrons to the semiconductor material, acting as electron donors. Examples of n-type dopants for silicon or other group IV semiconductors include group V elements, such as phosphorus, arsenic, antimony, and the like. For semiconductors with more than one type of atom, for example III-V semiconductors such as gallium arsenide, indium phosphide, and the like, whether a dopant is an n-type dopant or a p-type dopant may depend on which element the dopant replaces. For example, when silicon is used as a dopant for gallium arsenide, the silicon donates electrons when it replaces gallium and accepts electrons when it replaces arsenic. Other dopants, such as alkali metals, are n-type dopants for most semiconductors. One of skill in the art, in light of this disclosure, will recognize other dopants for use in the n-type semiconductor layer 204 of the photovoltaic semiconductor layer 112 based on the type of semiconductor selected for use.

In one embodiment, the p-type semiconductor layer 206 of the photovoltaic semiconductor layer 112 generates (or donates) holes, or positive charges, as the majority charge carrier. The p-type semiconductor layer 206, in one embodiment, includes a semiconductor with dopant atoms that accept electrons from the semiconductor material, acting as electron acceptors. The vacancy left behind by an electron is referred to as a hole and has a net positive charge once the electron has been conducted away. Examples of p-type dopants for silicon include group IIIA elements, such as boron, aluminum, and the like and other elements with a trivalent atom. One of skill in the art, in light of this disclosure, will recognize other dopants for use in the p-type semiconductor layer 206 of the photovoltaic semiconductor layer 112 based on the type of semiconductor selected for use.

In one embodiment, the n-type semiconductor layer 204 and/or the p-type semiconductor layer 206 may be formed from a semiconductor wafer that is doped using an implantation or diffusion process. In another embodiment, the n-type semiconductor layer 204 and/or the p-type semiconductor layer 206 may be fabricated or grown with dopants present. One of skill in the art, in light of this disclosure, will recognize other methods of doping a semiconductor to form the n-type semiconductor layer 204 and the p-type semiconductor layer 206.

The n-type semiconductor layer 204 and the p-type semiconductor layer 206, in the depicted embodiment, form a p-n junction that exhibits the photovoltaic effect. As the electromagnetic radiation 104 impinges on the back side of the semiconductor chip 118 and into the photovoltaic semiconductor layer 112, the semiconductor material of the photovoltaic semiconductor layer 112 absorbs the photons of the electromagnetic radiation 104 and releases electrons, generating hole-electron pairs. Because of the electric field created by the depletion region of the p-n junction between the n-type semiconductor layer 204 and the p-type semiconductor layer 206, the excited electrons travel toward the n-type semiconductor layer 204, generating an electric current. While, for the sake of clarity, the electromagnetic radiation 104 is depicted by a single arrow, as described above with regard to FIGS. 1A and 1B, in certain embodiments, the electromagnetic radiation 104 may be spread or diffused to impinge across the back side of the semiconductor chip 118. In a further embodiment, the electromagnetic radiation 104 is distributed across substantially the entire surface of the photovoltaic semiconductor layer 112 that has a p-n junction.

In the depicted embodiment, one or more negative polarity electrical conductors 202 are disposed on the back side of the semiconductor chip 118 to receive or collect excited electrons from the photovoltaic semiconductor layer 112. In other embodiments, a bulk semiconductor layer and/or other layers may be disposed between the one or more negative polarity electrical conductors 202 and the back side of the semiconductor chip 118. The one or more negative polarity electrical conductors 202, in one embodiment, are configured to let a majority or all of the electromagnetic radiation 104 pass through to the photovoltaic semiconductor layer 112. For example, the one or more negative polarity electrical conductors 202 may include a grid of conductive material, a transparent conducting film, a conductive mesh, or the like so that the electromagnetic radiation 104 passes through the one or more negative polarity electrical conductors 202 to reach the photovoltaic semiconductor layer 112.

In one embodiment, one or more positive polarity electrical conductors 208 are disposed on an opposite side of the photovoltaic semiconductor layer 112 from the one or more negative polarity electrical conductors 202. The one or more positive polarity electrical conductors 208, in the depicted embodiment, are disposed between the photovoltaic semiconductor layer 112 and the active semiconductor layer 114. The one or more positive polarity electrical conductors 208, in one embodiment, complete the circuit between the one or more negative polarity electrical conductors 202 and the integrated circuit devices 216 of the active semiconductor layer 114, providing the electrons back to the p-type semiconductor layer 206 of the photovoltaic semiconductor layer 112. In one embodiment, the one or more positive polarity electrical conductors 208 metaphorically receive holes, or net positive charges from the p-type semiconductor layer 206 as electrons move from the one or more positive polarity electrical conductors 208 to the p-type semiconductor layer 206. The one or more positive polarity electrical conductors 208, in various embodiments, may include one or more metallization layers or other electrically conductive material disposed between the p-type semiconductor layer 206 of the photovoltaic semiconductor layer 112 and the active semiconductor layer 114.

In one embodiment, the one or more conductive pathways 210, 212 between the photovoltaic semiconductor layer 112 and the active semiconductor layer 114 provide the electric power from the photovoltaic semiconductor layer 112 to the one or more integrated circuit devices 216 of the active semiconductor layer 114. In the depicted embodiment, the one or more conductive pathways 210, 212 are in electrical communication with the one or more positive polarity electrical conductors 208 and the one or more negative polarity electrical conductors 202. The one or more conductive pathways 210, 212, in a further embodiment, are in electrical communication with one or more power conditioning circuits that convert the electric power to a form usable by the integrated circuit devices 216.

In the depicted embodiment, the active semiconductor layer 114 includes the one or more integrated circuit devices 216 that operate using electric power from the photovoltaic semiconductor layer 112. The one or more integrated circuit devices 216, in various embodiments, may include transistors, diodes, capacitors, inductors, resistors, and/or other semiconductor devices, passive components, or the like. The one or more integrated circuit devices 216, in certain embodiments, may form one or more logic gates, memory cells, and/or other types of integrated circuits. The integrated circuit devices 216, in a further embodiment, are fabricated on the surface of a semiconductor substrate of the active semiconductor layer 114, toward the front side of the semiconductor chip 118. As described above with regard to FIG. 1A, in one embodiment, at least a portion of the active semiconductor layer 114 and the one or more integrated circuit devices 216 are epitaxially grown onto the photovoltaic semiconductor layer 112, or vice versa. The one or more integrated circuit devices 216, in certain embodiments, may include CMOS logic, NMOS logic, PMOS logic, TTL, DTL, ECL, BiCMOS logic, IIL, and/or other types of logic circuits.

In one embodiment, the integrated circuit devices 216 receive the electric power from the photovoltaic semiconductor layer 112 substantially as the photovoltaic semiconductor layer 112 generates the electric power, with little or no power conditioning or other manipulation of voltage or current. For example, in one embodiment, the electromagnetic radiation source 102, the electromagnetic radiation 104, the photovoltaic semiconductor layer 112, and/or the one or more integrated circuit devices 216 may be selected such that the photovoltaic semiconductor layer 112 at or within a predefined range of the maximum power point of the photovoltaic semiconductor layer 112.

The maximum power point of the photovoltaic semiconductor layer 112, in one embodiment, is an electric load (i.e. a resistance) for which the photovoltaic semiconductor layer 112 provides the maximum electric power, or voltage times current ("V×I"), for a certain irradiation or illumination level of the electromagnetic radiation 104. The electric power provided by the photovoltaic semiconductor layer 112 at varying loads between a short circuit and an open circuit forms a load curve or power curve and the maximum power point is the maximum point on the curve. In a further embodiment described below with regard to FIG. 2B, the integrated circuit devices 216 receive the electric power from one or more power conditioning circuits 252 that convert the electric power into a form usable by the one or more integrated circuit devices 216 by adjusting the voltage and/or current levels of the electric power.

Figure 2B:
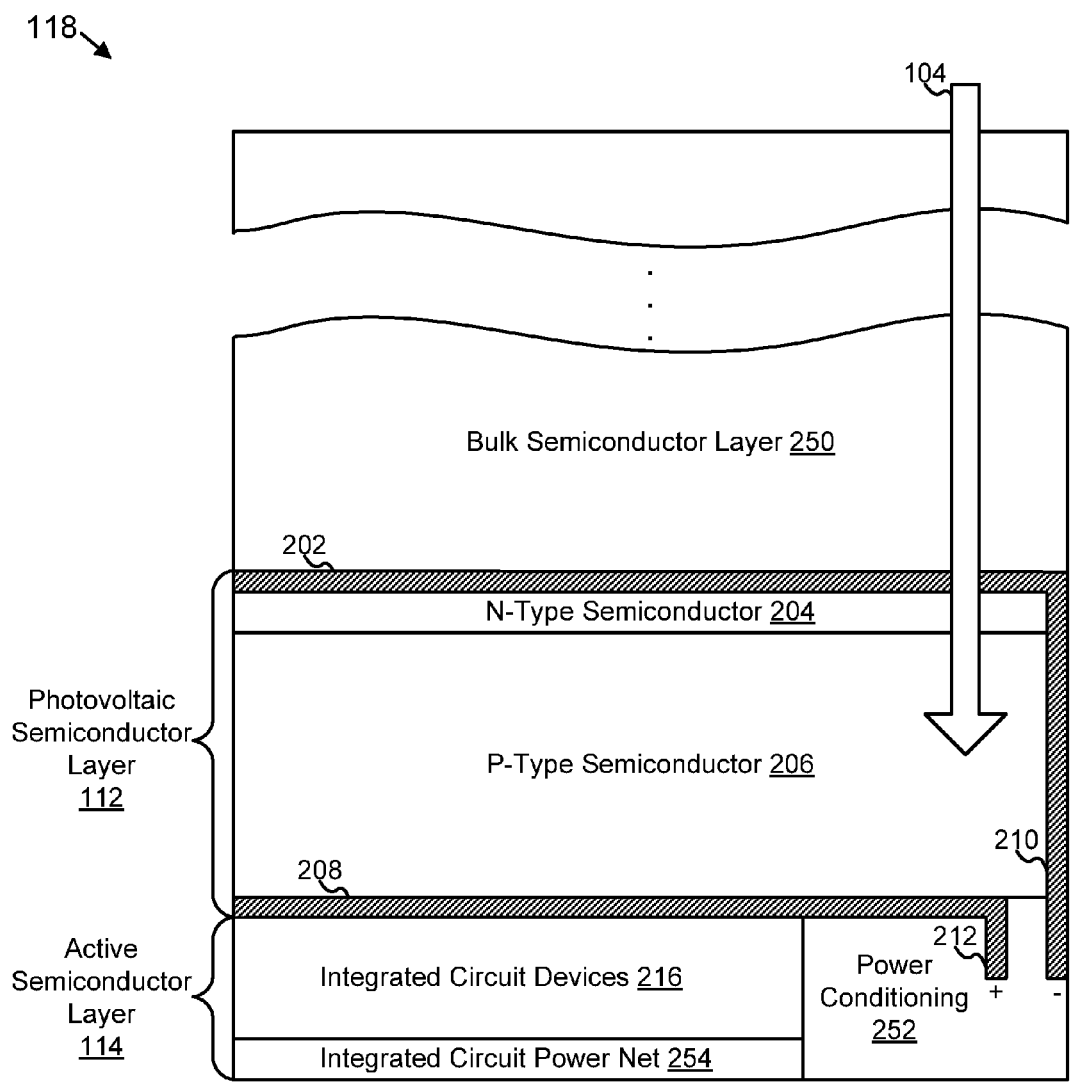
FIG. 2B is a cross-sectional schematic block diagram illustrating another embodiment of a semiconductor chip in accordance with the present invention.

FIG. 2B depicts another embodiment of a semiconductor chip 118. In one embodiment, the semiconductor chip 118 is substantially similar to the semiconductor chip 118 depicted in FIG. 2A, but further includes a bulk semiconductor layer 250, one or more power conditioning circuits 252, and an integrated circuit power net 254. Like the semiconductor chip 118 depicted in FIG. 2A, the semiconductor chip 118 in the depicted embodiment, is oriented with the integrated circuit devices 216 and the front side of the semiconductor chip 118 facing downward.

The bulk semiconductor layer 250, in one embodiment, includes a semiconductor substrate for the semiconductor chip 118, upon which the photovoltaic semiconductor layer 112 and/or the active semiconductor layer 114 are fabricated. The bulk semiconductor layer 250, in certain embodiments, is many times thicker than the photovoltaic semiconductor layer 112 and/or the active semiconductor layer 114.

The bulk semiconductor layer 250, in various embodiments, may be formed of silicon, a III-IV semiconductor, another semiconductor, or the like. In one embodiment, the bulk semiconductor layer 250 is formed of a high purity or substantially pure semiconductor, with little or no impurities. In other embodiments, the bulk semiconductor layer 250 may include dopant impurity atoms to dope the bulk semiconductor layer 250 as either n-type or p-type. In one embodiment, multiple semiconductor chips 118 may be fabricated from a semiconductor wafer including the bulk semiconductor layer 250. In one embodiment, the bulk semiconductor layer 250 includes a monocrystalline semiconductor, such as monocrystalline silicon, a monocrystalline III-V semiconductor, or the like. Monocrystalline semiconductors, in certain embodiments, may be formed using the Czochralski process, or the like.

In the depicted embodiment, the bulk semiconductor layer 250 is disposed between the photovoltaic semiconductor layer 112 and the back side of the semiconductor chip 118. As described above with regard to FIG. 1A, in certain embodiments, the electromagnetic radiation source 102 provides the electromagnetic radiation 104 at one or more wavelengths to which the bulk semiconductor layer 250 is substantially transparent, but which the n-type semiconductor layer 204 and the p-type semiconductor layer 206 (and/or associated dopants) of the photovoltaic semiconductor layer 112 readily absorb. In one embodiment, a bulk semiconductor layer of silicon, such as monocrystalline silicon or the like, is transparent to wavelengths between about 0.8 microns and about 2 microns and the n-type semiconductor layer 204 and the p-type semiconductor layer 206 absorb wavelengths between about 0.8 microns and about 2 microns. As depicted in FIG. 2B, in certain embodiments some or all of the electromagnetic radiation 104 passes through the bulk semiconductor layer 250 into the photovoltaic semiconductor layer 112 where the n-type semiconductor layer 204 and/or the p-type semiconductor layer 206 absorb photons of the electromagnetic radiation 104, freeing electrons to create an electric current and generate electric power.

In one embodiment, the photovoltaic semiconductor layer 112 and/or the active semiconductor layer 114 are grown, deposited, or otherwise fabricated onto the bulk semiconductor layer 250, using an epitaxial process, or the like. In another embodiment, instead of both the photovoltaic semiconductor layer 112 and the active semiconductor layer 114 being disposed to a single side of the bulk semiconductor layer 250 as depicted, the bulk semiconductor layer 250 may be disposed between the photovoltaic semiconductor layer 112 and the active semiconductor layer 114. For example, in one embodiment, the photovoltaic semiconductor layer 112 may be disposed toward the back side of the semiconductor chip 118 and the active semiconductor layer 114 toward the front side of the semiconductor chip 118 with the bulk semiconductor layer 250 between them. The one or more conductive pathways 210, 212, in one embodiment, are sized to extend through or around a bulk semiconductor layer 250 disposed between the photovoltaic semiconductor layer 112 and the active semiconductor layer 114.

In one embodiment, the one or more power conditioning circuits 252 convert electric power from the photovoltaic semiconductor layer 112 into a form usable by the one or more integrated circuit devices 216 of the active semiconductor layer 114. The one or more power conditioning circuits 252, in one embodiment, combine electric power, either in parallel or in series, from several different photovoltaic elements (i.e. separate p-n junctions) of the photovoltaic semiconductor layer 112 to adjust the voltage and/or current of the electric power. In another embodiment, the one or more power conditioning circuits 252 include one or more direct current ("DC") to DC converters that convert a voltage and/or current of the electric power from one level to another, such as a switched-mode converter, a linear regulator, a magnetic converter, a capacitive converter, or the like. For example, in various embodiments, the one or more power conditioning circuits 252 may include a step-up converter such as a boost converter or the like, a step-down converter such as a buck converter or the like, a step-up or step-down converter such as a buck-boost converter or the like, and/or another type of DC to DC converter.

In one embodiment, the one or more power conditioning circuits 252 are configured to keep the photovoltaic semiconductor layer 112 at or within a predefined range of the maximum power point of the photovoltaic semiconductor layer 112, while providing the one or more integrated circuit devices 216 with electric power having a voltage level and current level at which the one or more integrated circuit devices 216 properly function. As described above, in certain embodiments, the electromagnetic radiation source 102 may provide the electromagnetic radiation 104 at a substantially constant intensity level and wavelength (or set of wavelengths), and the photovoltaic semiconductor layer 112 may provide electric power with a substantially consistent voltage and/or current for a given load. In certain embodiments, the one or more power conditioning circuits 252 are selected based on the engineered or known nature of the electromagnetic radiation source 102 and the electromagnetic radiation 104 to keep the photovoltaic semiconductor layer 112 operating at or within a predefined range of its maximum power point.

In the depicted embodiment, the one or more power conditioning circuits 252 are disposed in the active semiconductor layer 114 of the semiconductor chip 118. In a further embodiment, the one or more power conditioning circuits 252 may be included in the one or more integrated circuit devices 216 of the active semiconductor layer 114. In another embodiment, the one or more power conditioning circuits 252 may be included as active integrated circuit devices in the photovoltaic semiconductor layer 112, between photovoltaic elements, or the like. Similarly, in various embodiments, depending on the location of the one or more power conditioning circuits 252, the one or more power conditioning circuits 252 may receive electric power from the one or more conductive pathways 210, 212 and provide converted electric power to the integrated circuit devices 216, as depicted in FIG. 2B, or the one or more power conditioning circuits 252 may provide converted electric power to the one or more conductive pathways 210, 212, which may provide the converted power to the one or more integrated circuit devices 216.

In one embodiment, the one or more power conditioning circuits 252 and/or the one or more conductive pathways 210, 212 provide electric power to the one or more integrated circuit devices 216 over an integrated circuit power net 254 of the semiconductor chip 118. An integrated circuit power net 254 of a semiconductor chip 118, in one embodiment, includes a network of conductors that distribute power and ground connections to components of the semiconductor chip 118, such as the one or more integrated circuit devices 216, or the like. The integrated circuit power net 254 may include metalized layers with insulating material, such as dielectric, oxide, or glass materials, separating layers and conductors within layers. In further embodiments, the integrated circuit power net 254 may include wires or other conductors for providing electric power to the one or more integrated circuit devices 216.

The integrated circuit power net 254, in the depicted embodiment, receives electric power from the one or more power conditioning circuits 252. In other embodiments, the integrated circuit power net 254 may receive electric power directly from the one or more conductive pathways 210, 212 (either already converted by the one or more power conditioning circuits 252 or without any power conditioning circuits 252). The integrated circuit power net 254, in certain embodiments, may be integrated and/or layered with an input/output net of the semiconductor chip 118 that provides input and output connections to the one or more integrated circuit devices 216.

FIG. 3 depicts a further embodiment of a semiconductor chip 118. In various embodiments, the semiconductor chip 118 may be substantially similar to the semiconductor chips 118 described above with regard to FIGS. 1A, 1B, 2A, and 2B. As depicted, the semiconductor chip 118 of FIG. 3 has a flipped orientation compared to the semiconductor chips 118 of FIGS. 1A, 1B, 2A, and 2B. The semiconductor chip 118, in the depicted embodiment, is oriented with the integrated circuit devices 216 and the front side of the semiconductor chip 118 facing upward, as they may face during or after fabrication prior to being placed on a circuit board 116, or the like. The orientation of the back side of the semiconductor chip 118 and the front side of the semiconductor chip 118, in certain embodiments, is irrelevant so long as the electromagnetic radiation 104 impinges the back side of the semiconductor chip 118.

The active semiconductor layer 114, in the depicted embodiment, includes an n-type MOSFET 216a and a p-type MOSFET 216b in a p-type semiconductor layer 302, or substrate. The n-type MOSFET 216a and the p-type MOSFET 216b may be part of one or more CMOS logic circuits, memory cells, or other types of integrated circuits. The n-type MOSFET 216a and the p-type MOSFET 216b are depicted as example embodiments of integrated circuit devices 216. In other embodiments, the integrated circuit devices 216 may include other types of integrated circuit components.

The n-type MOSFET 216*a*, in the depicted embodiment, includes a p-type semiconductor body B, an n-type semiconductor source S, an n-type semiconductor drain D, and a gate G (of metal, silicon, or the like) that bridges the source and the drain, with an insulator layer between the gate and the source/drain. The p-type MOSFET 216*b*, in the depicted embodiment, includes an n-type semiconductor body B, a p-type semiconductor source S, a p-type semiconductor drain D, and a gate G (of metal, silicon, or the like) that bridges the source and the drain, with an insulator layer between the gate and the source/drain, within an n-type semiconductor well. The bodies, sources, drains, and gates of the n-type MOSFET 216*a* and the p-type MOSFET 216*b*, in the depicted embodiment, each comprise a contact for power or ground from the integrated circuit power net 254 or for inputs/outputs from an integrated circuit input/output net, or the like.

In one embodiment, the p-type semiconductor layer 302 substrate and/or the integrated circuit devices 216*a*, 216*b* are epitaxially grown or otherwise fabricated onto the photovoltaic semiconductor layer 112. The depicted embodiment includes an oxide layer 304 disposed between the active semiconductor layer 114 and the photovoltaic semiconductor layer 112. The oxide layer 304, in the depicted embodiment, includes several breaks or gaps filled with p-type semiconductor material that are aligned with the one or more positive polarity electrical conductors 208, to allow electrons from the positive polarity electrical conductors 208 to travel to the p-type semiconductor layer 206.

The photovoltaic semiconductor layer 112, in the depicted embodiment, includes the p-type semiconductor layer 206 and the n-type semiconductor layer 204 and further includes an oxide layer 306 and an anti-reflective layer 308. The oxide layer 306, in one embodiment, electrically insulates the n-type semiconductor layer 204. The anti-reflective layer 308, in a further embodiment, reduces or eliminates the amount of the electromagnetic radiation 104 that reflects off of the back side of the semiconductor chip 118. The back side of the semiconductor chip 118, in the depicted embodiment, has an angled pattern, such that at least a portion of any electromagnetic radiation 104 that is reflected off of the back side of the semiconductor chip 118, in certain embodiments, is reflected back toward the back side of the semiconductor chip 118, so that the photovoltaic semiconductor layer 112 can convert it to electric power.

In one embodiment, a bulk semiconductor layer 250 may be disposed between the back side of the semiconductor chip 118 and the semiconductor layer 112, as described above with regard to FIG. 2B. In various embodiments, a bulk semiconductor layer 250 may be disposed between the n-type semiconductor layer 204 and the oxide layer 306, between the oxide layer 306 and the anti-reflective layer 308, below the anti-reflective layer 308, or the like. In another embodiment, a bulk semiconductor layer 250 may replace one or more of the oxide layer 306 and the anti-reflective layer 308, or the like.

Figure 4:
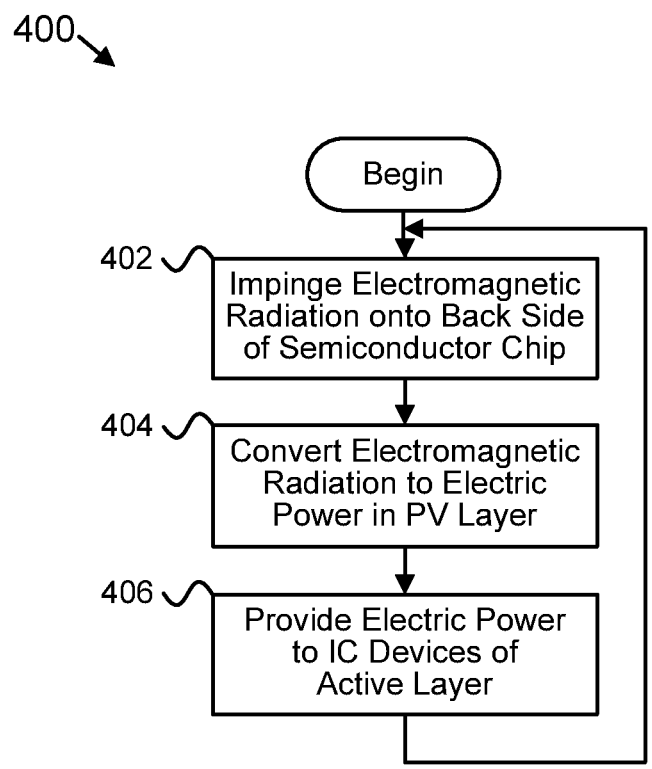
FIG. 4 is a schematic flow chart diagram illustrating one embodiment of a method for providing optical power to a semiconductor in accordance with the present invention.

FIG. 4 depicts one embodiment of a method 400 for providing optical power to a semiconductor chip 118. In the depicted embodiment, the method 400 begins and the electromagnetic radiation source 102 impinges 402 electromagnetic radiation 104 onto a back side of a semiconductor chip 118. The photovoltaic semiconductor layer 112 of the semiconductor chip 118 converts 404 the electromagnetic radiation 104 to electric power.

One or more conductive pathways 210, 212, in the depicted embodiment, provide 406 the electric power from the photovoltaic semiconductor layer 112 to one or more integrated circuit devices 216 of an active semiconductor layer 114 of the semiconductor chip 118. In the depicted embodiment, the electromagnetic radiation source 102 continues to impinge 402 the electromagnetic radiation 104 onto the back side of the semiconductor chip 118 to provide power to the semiconductor chip 118 and the method 400 continues.

Figure 5:
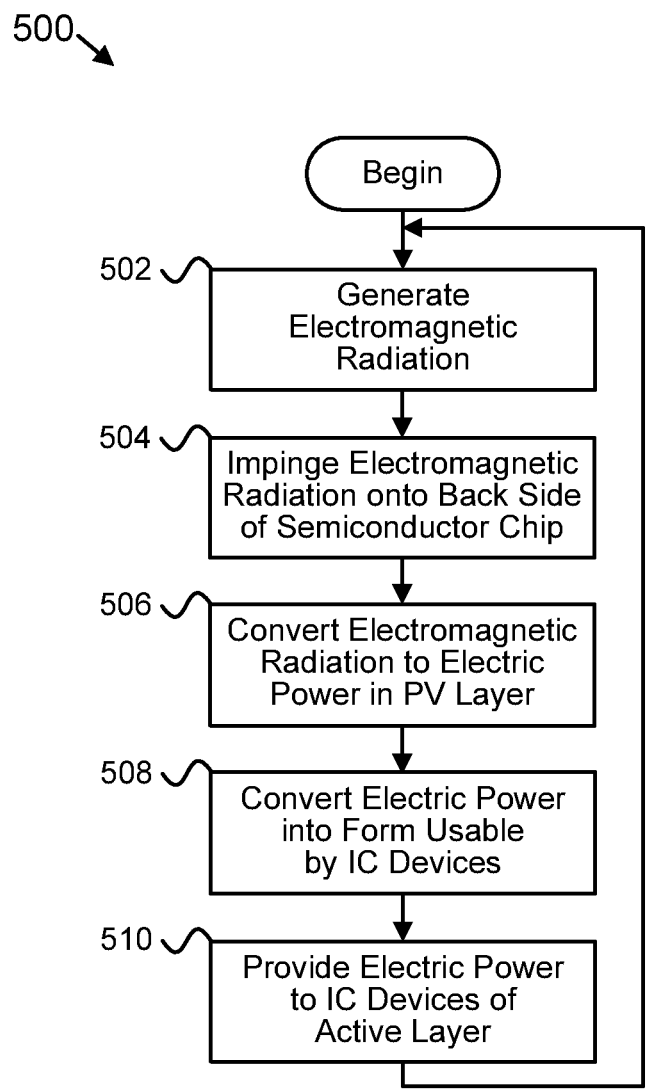
FIG. 5 is a schematic flow chart diagram illustrating another embodiment of a method for providing optical power to a semiconductor in accordance with the present invention.

FIG. 5 depicts an embodiment of a method 500 for providing optical power to a semiconductor chip 118. In the depicted embodiment, the method 500 begins and the electromagnetic radiation source 102 generates 502 electromagnetic radiation 104. The electromagnetic radiation source 102, in the depicted embodiment, impinges 504 electromagnetic radiation 104 onto a back side of a semiconductor chip 118. The photovoltaic semiconductor layer 112 of the semiconductor chip 118 converts 506 the electromagnetic radiation 104 to electric power.

One or more power conditioning circuits 252, in the depicted embodiment, convert 508 the electric power into a form usable by one or more integrated circuit devices 216 of an active semiconductor layer 114 of the semiconductor chip 118. One or more conductive pathways 210, 212, in the depicted embodiment, provide 510 the converted electric power to one or more integrated circuit devices 216 of an active semiconductor layer 114 of the semiconductor chip 118. In the depicted embodiment, the electromagnetic radiation source 102 continues to generate 502 the electromagnetic radiation 104, to impinge 504 the electromagnetic radiation 104 onto the back side of the semiconductor chip 118 to provide power to the semiconductor chip 118 and the method 500 continues.

What is claimed is:

1. An apparatus to provide optical power to a semiconductor, the apparatus comprising:

an active semiconductor layer of a semiconductor chip, the active semiconductor layer disposed toward a front side of the semiconductor chip, the active semiconductor layer comprising one or more integrated circuit devices;

a photovoltaic semiconductor layer of the semiconductor chip, the photovoltaic semiconductor layer disposed between the active semiconductor layer and a back side of the semiconductor chip, the back side of the semiconductor chip opposite the front side of the semiconductor chip, the photovoltaic semiconductor layer converting electromagnetic radiation to electric power;

one or more conductive pathways between the photovoltaic semiconductor layer and the active semiconductor layer; and one or more positive polarity electrical conductors disposed between the photovoltaic semiconductor layer and the active semiconductor layer and one or more negative polarity electrical conductors disposed on an opposite side of the photovoltaic semiconductor layer as the one or more positive polarity electrical conductors, the one or more conductive pathways in electrical communication with the one or more positive polarity electrical conductors and the one or more negative polarity electrical conductors to provide the electric power from the photovoltaic semiconductor layer to the integrated circuit devices of the active semiconductor layer.

2. The apparatus of claim 1, further comprising an electromagnetic radiation source that provides the electromagnetic radiation to the photovoltaic semiconductor layer, the electromagnetic radiation source impinging the electromagnetic radiation onto the back side of the semiconductor chip.

3. The apparatus of claim 2, further comprising a bulk semiconductor layer disposed between the photovoltaic semiconductor layer and the back side of the semiconductor chip, wherein the electromagnetic radiation source provides the electromagnetic radiation at one or more wavelengths to which the bulk semiconductor layer is substantially transparent such that at least a portion of the electromagnetic radiation passes through the bulk semiconductor layer to the photovoltaic semiconductor layer.

4. The apparatus of claim 3, wherein the one or more wavelengths are between about 0.8 microns and about 2 microns.

5. The apparatus of claim 2, wherein the electromagnetic radiation source comprises a laser device that provides the electromagnetic radiation as a coherent beam.

6. The apparatus of claim 5, wherein the laser device provides the coherent beam in a continuous wave mode and the electromagnetic radiation of the coherent beam is substantially constant over time during operation.

7. The apparatus of claim 1, further comprising one or more fiber optic channels directing the electromagnetic radiation to the photovoltaic semiconductor layer such that the electromagnetic radiation impinges onto the back side of the semiconductor chip.

8. The apparatus of claim 1, further comprising one or more mirrors positioned to reflect the electromagnetic radiation to the photovoltaic semiconductor layer such that the electromagnetic radiation impinges onto the back side of the semiconductor chip.

9. The apparatus of claim 1, further comprising one or more power conditioning circuits disposed in a layer of the semiconductor chip, the one or more power conditioning circuits converting the electric power from the photovoltaic semiconductor layer into a form usable by the one or more integrated circuit devices of the active semiconductor layer and providing the converted electric power to the one or more integrated circuit devices over an integrated circuit power net of the semiconductor chip, the one or more power conditioning circuits in electrical communication with the one or more conductive pathways.

10. The apparatus of claim 1, wherein the photovoltaic semiconductor layer comprises an anti-reflective layer, an oxide layer, an n-type semiconductor layer, and a p-type semiconductor layer, the n-type semiconductor layer disposed adjacent to the p-type semiconductor layer to form a p-n junction that converts the electromagnetic radiation to electric power.

11. The apparatus of claim 1, wherein at least a portion of one of the photovoltaic semiconductor layer and the active semiconductor layer is epitaxially grown on the other of the photovoltaic semiconductor layer and the active semiconductor layer.

12. The apparatus of claim 1, wherein the one or more integrated circuit devices of the active semiconductor layer comprise complementary metal-oxide-semiconductor ("CMOS") logic integrated circuit devices.

13. The apparatus of claim 1, wherein the semiconductor chip comprises a silicon-based semiconductor chip and the photovoltaic semiconductor layer and the active semiconductor layer each comprise a silicon semiconductor layer.

14. A system to provide optical power to a semiconductor, the system comprising:
a semiconductor chip comprising a front side and a back side, the front side of the semiconductor chip opposite the back side of the semiconductor chip;
an electromagnetic radiation source that impinges electromagnetic radiation onto the back side of the semiconductor chip;
an active semiconductor layer of the semiconductor chip, the active semiconductor layer disposed toward the front side of the semiconductor chip, the active semiconductor layer comprising one or more integrated circuit devices;
a photovoltaic semiconductor layer of the semiconductor chip, the photovoltaic semiconductor layer disposed between the active semiconductor layer and the back side of the semiconductor chip, the photovoltaic semiconductor layer converting the electromagnetic radiation from the electromagnetic radiation source to electric power;
one or more conductive pathways of the semiconductor chip between the photovoltaic semiconductor layer and the active semiconductor layer; and
one or more positive polarity electrical conductors disposed between the photovoltaic semiconductor layer and the active semiconductor layer and one or more negative polarity electrical conductors disposed on an opposite side of the photovoltaic semiconductor layer as the one or more positive polarity electrical conductors, the one or more conductive pathways in electrical communication with the one or more positive polarity electrical conductors and the one or more negative polarity electrical conductors to provide the electric power from the photovoltaic semiconductor layer to the integrated circuit devices of the active semiconductor layer.

15. The system of claim 14, further comprising one or more additional semiconductor chips such that the semiconductor chip and the one or more additional semiconductor chips form a plurality of semiconductor chips, each semiconductor chip of the plurality of semiconductor chips comprising a photovoltaic semiconductor layer, an active semiconductor layer, and one or more conductive pathways, the electromagnetic radiation source impinging electromagnetic radiation onto backsides of each of the plurality of semiconductor chips.

16. The system of claim 14, further comprising one or more fiber optic channels between the electromagnetic radiation source and the photovoltaic semiconductor layer, the one or more fiber optic channels directing the electromagnetic radiation to the photovoltaic semiconductor layer such that the electromagnetic radiation impinges onto the back side of the semiconductor chip.

17. The system of claim 14, further comprising one or more mirrors between the electromagnetic radiation source and the photovoltaic semiconductor layer, the one or more minors positioned to reflect the electromagnetic radiation from the electromagnetic radiation source to the photovoltaic semiconductor layer such that the electromagnetic radiation impinges onto the back side of the semiconductor chip.

18. The system of claim 14, further comprising one or more power conditioning circuits disposed in a layer of the semiconductor chip, the one or more power conditioning circuits converting the electric power from the photovoltaic semiconductor layer into a form usable by the one or more integrated circuit devices of the active semiconductor layer and providing the converted electric power to the one or more integrated circuit devices over an integrated circuit power net of the semiconductor chip, the one or more power conditioning circuits in electrical communication with the one or more conductive pathways.

19. The system of claim 14, further comprising a bulk semiconductor layer of the semiconductor chip, the bulk semiconductor layer disposed between the photovoltaic semiconductor layer and the back side of the semiconductor chip, wherein the electromagnetic radiation source provides the electromagnetic radiation at one or more wavelengths to which the bulk semiconductor layer is substantially transparent such that at least a portion of the electromagnetic radiation passes through the bulk semiconductor layer to the photovoltaic semiconductor layer.

20. A method for providing optical power to a semiconductor, the method comprising:
impinging electromagnetic radiation onto a back side of a semiconductor chip;
converting the electromagnetic radiation to electric power using a photovoltaic semiconductor layer of the semiconductor chip, the photovoltaic semiconductor layer disposed between an active semiconductor layer of the semiconductor chip and the back side of the semiconductor chip; and
providing the electric power from the photovoltaic semiconductor layer to one or more integrated circuit devices of the active semiconductor layer using one or more positive polarity electrical conductors disposed between the photovoltaic semiconductor layer and the active semiconductor layer and one or more negative polarity electrical conductors disposed on an opposite side of the photovoltaic semiconductor layer as the one or more positive polarity electrical conductors, the one or more positive polarity electrical conductors and the one or more negative polarity electrical conductors in electrical communication with one or more conductive pathways between the photovoltaic semiconductor layer and the active semiconductor layer, the active semiconductor layer disposed toward a front side of the semiconductor chip, the front side of the semiconductor chip opposite the back side of the semiconductor chip.

21. The method of claim 20, further comprising generating the electromagnetic radiation at one or more wavelengths to which a bulk semiconductor layer of the semiconductor chip is substantially transparent such that at least a portion of the electromagnetic radiation passes through the bulk semiconductor layer to the photovoltaic semiconductor layer, the bulk semiconductor layer of the semiconductor chip disposed between the photovoltaic semiconductor layer and the back side of the semiconductor chip.

22. The method of claim 20, further comprising converting the electric power from the photovoltaic semiconductor layer into a form usable by the one or more integrated circuit devices of the active semiconductor layer using one or more power conditioning circuits disposed in a layer of the semiconductor chip.

23. An apparatus to provide optical power to a semiconductor, the apparatus comprising:
an active semiconductor layer of a silicon-based semiconductor chip, the active semiconductor layer disposed toward a front side of the silicon-based semiconductor chip, the active semiconductor layer comprising one or more complementary metal-oxide-semiconductor ("CMOS") logic integrated circuit devices;
a photovoltaic semiconductor layer of a silicon-based semiconductor chip, the photovoltaic semiconductor layer disposed between the active semiconductor layer and a back side of the silicon-based semiconductor chip, the back side of the silicon-based semiconductor chip opposite the front side of the silicon-based semiconductor chip, the photovoltaic semiconductor layer converting electromagnetic radiation to electric power;
a bulk semiconductor layer disposed between the photovoltaic semiconductor layer and the back side of the semiconductor chip, the photovoltaic semiconductor layer receiving electromagnetic radiation from an electromagnetic radiation source at one or more wavelengths to which the bulk semiconductor layer is substantially transparent such that at least a portion of the electromagnetic radiation passes through the bulk semiconductor layer to the photovoltaic semiconductor layer;
one or more conductive pathways of the silicon-based semiconductor chip between the photovoltaic semiconductor layer and the active semiconductor layer; and
one or more positive polarity electrical conductors disposed between the photovoltaic semiconductor layer and the active semiconductor layer and one or more negative polarity electrical conductors disposed on an opposite side of the photovoltaic semiconductor layer as the one or more positive polarity electrical conductors, the one or more conductive pathways in electrical communication with the one or more positive polarity electrical conductors and the one or more negative polarity electrical conductors to provide the electric power from the photovoltaic semiconductor layer to the one or more CMOS logic integrated circuit devices of the active semiconductor layer.

* * * * *